United States Patent [19]
Kim

[11] Patent Number: 4,608,586
[45] Date of Patent: Aug. 26, 1986

[54] BACK-ILLUMINATED PHOTODIODE WITH A WIDE BANDGAP CAP LAYER

[75] Inventor: Ock-Ky Kim, Bridgewater, N.J.

[73] Assignee: AT&T Bell Laboratories, Murray Hill, N.J.

[21] Appl. No.: 609,317

[22] Filed: May 11, 1984

[51] Int. Cl.$^4$ .............................................. H01L 27/14
[52] U.S. Cl. ...................................... 357/30; 357/16; 250/211 J
[58] Field of Search ................ 250/211 J; 357/30, 19, 357/16, 58

[56] References Cited
U.S. PATENT DOCUMENTS
4,068,252  1/1978  Lebailly ............................ 357/30 X

OTHER PUBLICATIONS

"Low Dark-Current, High-Efficiency Planar $In_{0.53}Ga_{0.47}As$/InP P–I–N Photodiodes", *IEEE Electron Device Letters*, vol. EDL-1, No. 11, Nov. 1981, pp. 283–285, S. R. Forrest et al.

"InGaAs Planar Photodiode with a Window Layer", 1981 *Domestic Meeting of the Semiconductors and Materials Division, the Institute of Electronics and Communication Engineers of Japan*, Y. Tashiro et al., pp. 1–4.

Primary Examiner—John D. Welsh
Attorney, Agent, or Firm—Michael J. Urbano

[57] ABSTRACT $In_{0.53}Ga_{0.47}As$ p-i-n photodiodes with room temperature dark currents as low as 0.1 nA at −10 V bias are realized by introducing a wide bandgap (e.g., quaternary InGaAsP) cap layer on the ternary InGaAs.

11 Claims, 4 Drawing Figures

BACK-ILLUMINATED PHOTODIODE WITH A WIDE BANDGAP CAP LAYER

BACKGROUND OF THE INVENTION

This invention relates to photodetectors and, more particularly, to InGaAs photodiodes.

Lightwave communications systems in the long wavelength range of about 1.0–1.6 μm have stimulated the development of photodiodes from $In_{0.53}Ga_{0.47}As$ because the bandgap (0.75 eV) of this material is suitable for efficiently detecting lightwaves in that wavelength range and because the material is essentially lattice matched to InP substrates.

These devices may be either mesa photodiodes or planar photodiodes. The former tend to have lower dark currents but generally have not been adequately passivated and have low reliability for many important systems applications. Planar InGaAs photodiodes, on the other hand, trade off somewhat higher dark currents for better passivation and higher reliability.

In addition, InGaAs photodiodes may be either front-illuminated (lightwaves incident on the epitaxial layers) or back-illuminated (lightwaves incident on the transparent InP substrate). The front-illuminated variety is described by Y. Tashiro et al in an abstract entitled "InGaAs Planar Photodiode with a Window Layer," 1981 *Domestic Meeting of the Semiconductors and Materials Division, the Institute of Electronics and Communication Engineers of Japan*. FIG. 1 of the abstract shows a photodiode comprising an n-InP substrate, and InP buffer layer, an n-InGaAs light-absorbing layer, an n-InGaAsP window layer and p+-zone formed in the latter two layers by Cd diffusion. The p+-zone is formed under the opening of an annular contact on the window layer. Lightwaves directed through the opening are incident on the window layer and are absorbed in the InGaAs layer. The purpose of the InGaAsP window layer is to provide "good quantum efficiency" (about 80 percent in the wavelength range 1.3–1.6 μm as shown in FIG. 3 of the abstract). A dark current of about 1 nA at −5 V bias at room temperature is suggested by FIG. 2 of the abstract. In contrast, when a back-illuminated configuration is used, lightwaves are made incident on the transparent InP substrate, and so the InGaAsP window layer is omitted: that is, because lightwaves would not be incident on the window layer, it would have no affect on the quantum efficiency of the device. One such device is described by M. El Hamamsy et al in copending application Ser. No. 359,988 filed on Mar. 19, 1982, now abandoned. As with the front-illuminated photodiode, this back-illuminated device includes an n-InP substrate, an n-InP buffer layer, and an n-InGaAs light-absorbing layer, but contains no InGaAsP window layer. This InGaAs photodiode achieves dark currents of about 10 nA at −10 V bias by means of a restricted contact configuration shown in FIG. 1 herein. In addition, it is well passivated and highly reliable.

However, even lower dark currents would increase the photodiode's sensitivity and thus enable optical receivers to operate better at lower bit rates and/or higher ambient temperatures.

SUMMARY OF THE INVENTION

In accordance with one embodiment of my invention, the dark current of back-illuminated InGaAs photodiodes of the type described by El Hamamsy et al has been reduced by approximately one to two orders of magnitude (e.g., 0.1 nA at −10 V bias) by disposing a wide bandgap (e.g., InGaAsP) cap layer between the narrower bandgap InGaAs light-absorbing layer and the restricted contact. I have found that the wide bandgap layer reduces the surface generation current by lowering the intrinsic carrier concentraion of the surface layer.

It is expected that the wide bandgap cap layer will have similar advantageous effects in other back-illuminated semiconductor photodiode as well.

BRIEF DESCRIPTION OF THE DRAWING

My invention, together with its various features and advantages, can be readily understood from the following, more detailed description taken in conjunction with the accompanying drawing, in which.

DETAILED DESCRIPTION

Figure 2:
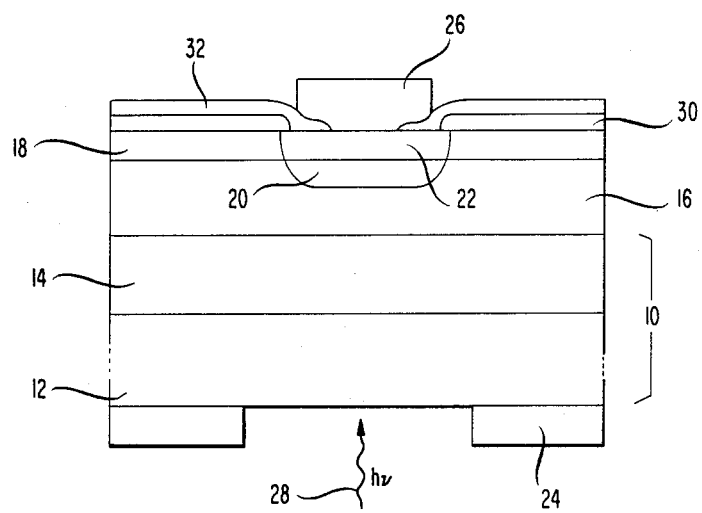
FIG. 2 is a schematic of a back-illuminated InGaAs photodiode in accordance with one embodiment of my invention.

With reference now to FIG. 2, there is shown a back-illuminated, planar, photodiode comprising a transparent semiconductor body 10 (illustratively a substrate 10 and a buffer layer 14), a light-absorbing layer 16, and a wide bandgap cap layer 18 for reducing surface generation current. A p-n junction 20 is formed by introducing impurities into the zone 22 of layers 16 and 18 by diffusion or other suitable technique.

The restricted contact 26, as described by El Hamamsy et al supra, inclused a first dielectric layer 30 having a first opening through which impurities are introduced to form zone 22 and p-n junction 22 so that the junction intersects the top surface of layer 18 at points recessed from the edges of the opening. A second dielectric layer 32 overlays the first and has a second, smaller opening which lies within the first opening. Contact 26 has a pedestal portion which contacts zone 22 through the second opening. The size of the openings is maintained such that the edges of the pedestal are relatively remote from the points where the junction 20 intersects the top of layer 18 (where the electric field is high). Illustratively, the ratio of the width of the first opening to that of the second is not less than about 3:1 (e.g., 75 μm:25 μm). In addition, contact 26 has a cap portion which seals the interface between the pedestal portion and the second dielectric layer so as to prevent contaminants from entering the device through that interface.

My investigations have demonstrated that the character of the top surface of the photodiode under the restricted contact is the principal factor in determining the level of dark current exhibited by the device. The wide bandgap layer 18 reduces surface generation current, and hence dark current, by lowering the intrinsic carrier concentration of the surface layer material.

In a preferred embodiment of my invention as shown in FIG. 2 the light absorbing layer 16 comprises lightly doped $In_{0.53}Ga_{0.47}As$ which is suitable for use in long wavelength systems operating at, for example, 1.0–1.6 μm. In this case the transparent body 10 includes an n-InP substrate 12 and an n-InP buffer layer 14. The cap layer 18 has a wider bandgap than the InGaAs layer 16 and is essentially lattice matched thereto. Suitable materials for the cap layer include, for example, InGaAsP, InP or AlInAs. From the sole standpoint of reducing dark current, the higher the bandgap of the cap layer the better. Thus, InP might be preferred over InGaAsP. However, processing considerations (e.g., the ability to make good ohmic contact) might dictate using a lower bandgap cap layer (which, however, must still have a higher bandgap than the light-absorbing layer). In addition, the cap layer 18 and light-absorbing layer 16 have the same conductivity type (n-type in this case), but the zone 22 is of opposite conductivity type (i.e., p-type). Because the cap layer is typically much thinner than the light-absorbing layer, the major portion of junction 20 is still located in the latter layer. As described in El Hamamsy et al supra, the dielectric layers 30 and 32 preferably comprise silicon nitride in order to reduce surface states and provide good adhesion to the underlying semiconductor.

This device is basically a p-i-n photodiode with the p-zone, i-zone and n-zone corresponding, respectively, to p-zone 20, lightly doped InGaAs layer 16 and n-type body 10. Operation at typically −10 V (reverse bias) is effective for detecting lightwaves 28 over a broad range of wavelengths (e.g., 1.0 to 1.6 μm) and digital bit rates (e.g., 3 Mb/s to 1.7 Gb/s).

EXAMPLE

This example describes InGaAs photodiodes in accordance with my invention. Various parameters, materials and processes are provided by way of illustration only and, unless otherwise specified, are not intended to limit the scope of the invention. The epitaxial layers of the photodiodes were grown by liquid-phase epitaxy (LPE) on a (100)-oriented InP substrate 12 doped n-type with sulphur. InP buffer layer 14 was unintentionally doped but was n-type. An InGaAsP cap layer 18 and an InGaAs light-absorbing layer 16 were lattice matched to InP and their carrier concentrations were about $n = 0.9 - 1 \times 10^{16}/cm^3$.

Diodes were fabricated by following the process steps described in El Hamamsy et al, supra. A first silicon nitride ($SiN_x$) layer 30 was deposited on the cap layer 18 by a plasma-assisted chemical-vapor deposition technique. Circular openings (diffusion windows) were defined by photolithography on layer 30, and then a p-n junction 20 was formed by Zn-diffusion. After diffusion, a second $SiN_x$ layer 32 was deposited over the first and smaller circular openings were similarly opened. As shown in FIG. 2, each smaller opening was positioned within one of the larger openings of the first $SiN_x$ layer 30. Electron beam evaporated contacts 24 and 26 were formed and then alloyed. A hole in this substrate metallization was aligned to the junction 20 using infrared alignment to allow for back illumination. No anti-reflection coating was included in the annulus of the contact 24, but in practice one may be used if desired.

A summary the characteristics of these photodiodes is given below:

Thickness of n-InGaAsP layer 18: 1.3 μm
Bandgap of InGaAsP layer 18: 0.95 eV
Thickness of n-InGaAs layer 16: 3.5 μm
Bandgap of InGaAs layer 16: 0.75 eV
Diffusion window area: $4.6 \times 10^{-5}$ cm$^2$
Junction depth: 2.5 μm
Median dark current at −10 V: 0.7 nA
Best dark current at −10 V: 0.1 nA
Capacitance at 0 V: 1.1 pF
Typical capacitance at −10 V: 0.46 pF
Quantum efficiency: ~65%
Rise time: 0.2 ns
Fall time: 0.7 ns The capacitance, quantum efficiency and response time of my photodiodes were similar to those observed in the planar InGaAs photodiodes of the type shown in FIG. 1 with comparable doping levels. The dark current was, however, much lower in my photodiodes than in the FIG. 1 photodiodes. In particular, the lowest dark current of my photodiodes was about 0.1 nA at −10 V whereas the lowest for the device of FIG. 1 was about 2–3 nA. This result suggests that the major source of dark current is related to surface effects or to differences in semiconductor-dielectric interface properties between the two structures.

The total dark current under reverse bias conditions is the sum of bulk and surface components. The bulk components consists of the diffusion current, generation-recombination current, and tunneling current. The surface component consists of surface generation current and leakage current via shunt paths probably formed at the semiconductor-dielectric interface in the planar devices.

Figure 3:
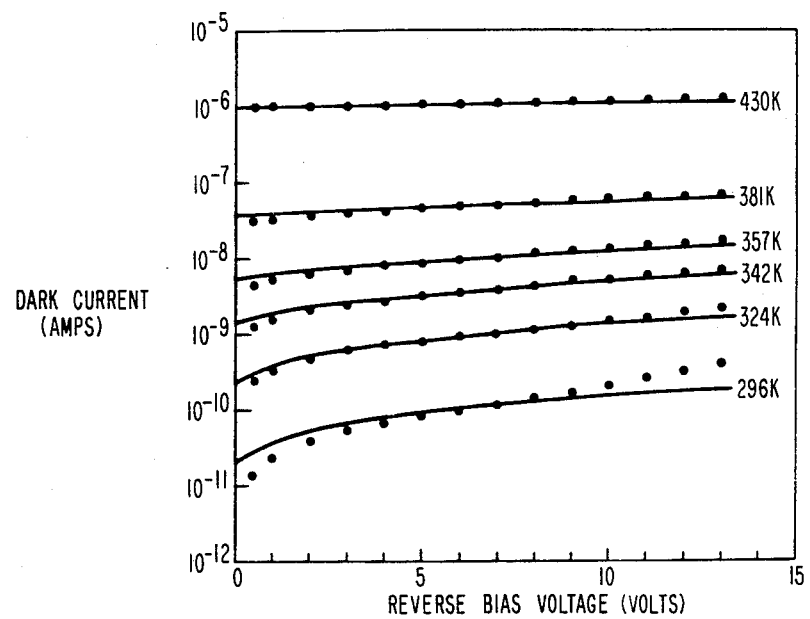
FIG. 3 is a graph of the current-voltage (I-V) characteristic of photodiodes under the reverse bias at various temperatures in accordance with one embodiment of my invention. The measured dark currents (black dots) and the calculated curves (dashes) are in good agreement.

In the small bias range, V<15 V for the reverse direction, the tunneling current can be neglected for $n \lesssim 1 \times 10^{16}/cm^3$. FIG. 3 shows the I-V characteristics at various temperatures on InGaAs photodiodes having an InGaAsP cap layer as described above in accordance with one embodiment of my invention.

Figure 1:
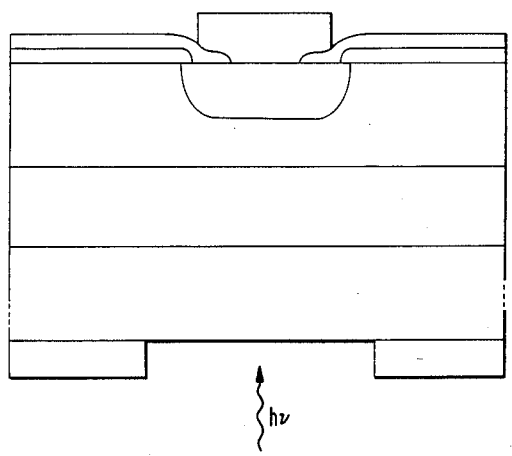
FIG. 1 is a schematic of a prior art, restricted contact, back-illuminated InGaAs photodiode.

In the prior art planar p-i-n photodiode of FIG. 1 and in the prior art mesa photodiode, the dark current ($I_D$) varies as $I_D \propto \sqrt{V_{bi} + V} \; (-E_g/2kT)$, where $V_{bi}$ is the built in junction potential, $E_g$ is the bandgap energy, V is the voltage, T is the absolute temperature, and k is Boltzmann's constant. This relationship suggests that the surface generation current limits the dark current. In my invention, however, the dark current does not exhibit $I_D \propto \sqrt{V_{bi} + V}$ nor $I_D \propto exp \; (-E_g/2kT)$ behavior. At high temperatures the diffusion current is important, and at room temperature the dark current exhibits a characteristic of $I_D \propto V$, suggesting that ohmic conduction is important and generation current is negligible.

Now assume that the surface generation velocity is the same in InGaAs and InGaAsP and that the bulk generation recombination current is negligible. The intrinsic carrier density is about 50 times less in InGaAsP with $E_g = 0.95$ eV than in InGaAs with $E_g = 0.75$ eV. The lowest room temperature dark current for a planar InGaAs diode is about 2.5 nA at −10 V which was reported by S. R. Forrest et al, *IEEE Trans Electron Devices*, Vol. EDL-2, pp. 283-285 (1981). Therefore, the surface generation current of my photodiode is estimated to be about 0.05 nA at −10 V. This value may be overestimated and conservative, because several mesa InGaAs diodes showed $I_D < 1$ nA. With the value of $n_i = 5 \times 10^{11}/cm^3$ for InGaAs, the estimated surface generation velocity is $\sim 1 \times 10^4$ cm/sec, which is comparable with surface recombination velocity of GaAs p-n junction. The surface generation current for my photodiode ranged from $4\times10^{-11}$A at 296° K. to $1.3\times10^{-8}$A at 430° K., indicating that this component contributes little to the diode dark current at high temperatures.

Figure 4:
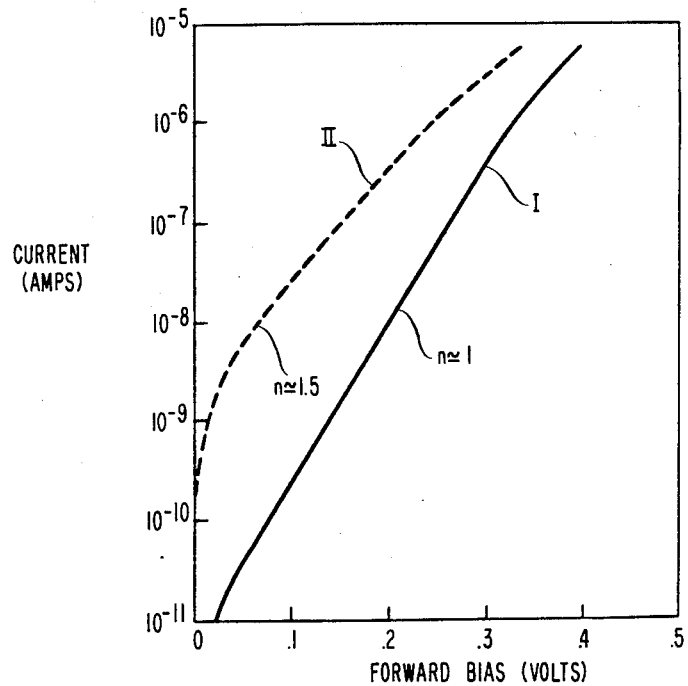
FIG. 4 compares the I-V curves for photodiodes under forward bias in accordance with one embodiment of my invention (solid line) and a prior art, restricted contact planar photodiode (dashed line).

Although the discussion above is centered primarily on the dark current characteristics under reverse bias conditions, the forward characteristics shown in FIG. 4 are also worth noting. An important indication is that the forward current is dominated by the diffusion current in my photodiodes.

For a forward biased diode, the n-factor defined by the equation, $$I_f = I_o \exp(qV/nkT),$$

is a parameter which indicates a dominant current source. An $n \simeq 1$ dependence is due to diffusion of minority carriers across the junction depletion region, and an $n \simeq 2$ dependence is due to bulk generation-recombination or surface generation currents. FIG. 4 shows I-V curves under forward bias for my photodiode (Curve I) and a prior art photodiode (Curve II) of the type shown in FIG. 1. As indicated, my photodiodes show an $n \simeq 1$ dependence, thus suggesting the dominance of diffusion current. On the other hand, $n \simeq 1.5$ for the prior art photodiode, presumably due to contributions from both diffusion and surface generation currents.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

In this regard, further reduction of the dark current can be achieved by increasing the bandgap of the cap layer, thus choosing a meterial of smaller intrinsic carrier concentration. In particular, InP may be a preferred cap layer for InGaAs photodiodes since it has the highest bandgap in the $In_{1-x}Ga_xAs_yP_{1-y}$ system and can be grown lattice matched on $In_{0.53}Ga_{0.47}As$. The surface leakage currents are known to be small in planar InP diodes and in planar InP/InGaAsP heterojunction diodes. InP layer can be grown in InGaAs by vapor-phase epitaxy.

What is claimed is:

1. A back-illuminated photodiode comprising:
    a semiconductor body of one conductivity type which is transparent to lightwaves to be detected,
    a first electrical contact to said body adapted to permit said lightwaves to be incident on said body,
    a light-absorbing layer of said one conductivity type formed on said body so as to absorb said lightwaves which are transmitted through said transparent body, thereby to generate electrons and holes in said light-absorbing layer,
    a cap layer of said one conductivity type formed on the side of said light-absorbing layer remote from said body and having a wider bandgap than said light-absorbing layer,
    a zone of opposite conductivity type extending through said cap layer and into said light-absorbing layer, thereby to form a junction for collecting said holes and electrons and generating a photocurrent, and
    a second electrical contact to said zone.

2. The photodiode of claim 1 wherein said body comprises InP and said light-absorbing layer comprises $In_{0.53}Ga_{0.47}As$.

3. The photodiode of claim 2 wherein said cap layer comprises InP.

4. The photodiode of claim 2 wherein said cap layer comprises AlInAs.

5. The photodiode of claim 2 wherein said cap layer comprises InGaAsP.

6. The photodiode of claims 1, 2, 3, 4 or 5 wherein said zone comprises a p-type zone diffused with acceptors.

7. The photodiode of claims 1, 2, 3, 4 or 5 wherein said cap layer is much thinner than said light-absorbing layer so that most of said junction lies within said light-absorbing layer.

8. A planar, back-illuminated photodiode comprising:
    a n-InP substrate,
    a n-InP epitaxial buffer layer formed on one surface of said substrate, said substrate and buffer layer being transparent to lightwaves to be detected,
    an annular electrical first contact formed on the opposite surface of said substrate, said lightwaves being incident on said substrate through the annulus of said first contact,
    an epitaxial, lightly doped $n-In_{0.53}Ga_{0.47}As$ light-absorbing layer formed on said buffer layer so as to absorb said lightwaves which are transmitted through said substrate and said buffer layer, thereby to generate electrons and holes in said light-absorbing layer,
    an epitaxial n-type cap layer formed on said light-absorbing layer and essentially lattice matched thereto, said cap layer having a wider bandgap than said light-absorbing layer so as to reduce surface leakage current and hence dark current,
    a p-type zone which extends through said cap layer and into said light-absorbing layer so as to form a p-i-n junction for collecting said holes and electrons and generating therefrom a photocurrent,
    said cap layer being thinner than said light-absorbing layer so that most of said junction lies within said light-absorbing layer, and
    a second electrical contact to said zone.

9. The photodiode of claim 8 wherein said cap layer comprises InP.

10. The photodiode of claim 8 wherein said cap layer comprises AlInAs.

11. The photodiode of claim 8 wherein said cap layer comprises InGaAsP.

* * * * *